(12) United States Patent
Li et al.

(10) Patent No.: US 11,527,548 B2
(45) Date of Patent: Dec. 13, 2022

(54) SEMICONDUCTOR DEVICES AND ELECTRONIC SYSTEMS INCLUDING AN ETCH STOP MATERIAL, AND RELATED METHODS

(71) Applicant: Micron Technology, Inc., Boise, ID (US)

(72) Inventors: Haoyu Li, Boise, ID (US); Everett A. McTeer, Eagle, ID (US); Christopher W. Petz, Boise, ID (US); Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/216,088

(22) Filed: Dec. 11, 2018

(65) Prior Publication Data

US 2020/0185406 A1  Jun. 11, 2020

(51) Int. Cl.
*H01L 27/11582* (2017.01)
*H01L 27/11556* (2017.01)
*H01L 27/1157* (2017.01)
*H01L 21/311* (2006.01)
*H01L 27/11524* (2017.01)
*H01L 21/28* (2006.01)

(52) U.S. Cl.
CPC .. *H01L 27/11582* (2013.01); *H01L 27/11556* (2013.01); *H01L 21/31111* (2013.01); *H01L 21/31122* (2013.01); *H01L 27/1157* (2013.01); *H01L 27/11524* (2013.01); *H01L 29/40114* (2019.08); *H01L 29/40117* (2019.08)

(58) Field of Classification Search
CPC ......... H01L 27/11582; H01L 27/11556; H01L 2924/0002; H01L 29/66825; H01L 27/11517; H01L 29/42324; H01L 29/788; H01L 29/42328; H01L 29/4234; H01L 29/42364; H01L 29/42336
See application file for complete search history.

(56) References Cited

U.S. PATENT DOCUMENTS

| | | | |
|---|---|---|---|
| 8,687,426 B2 | 4/2014 | Fishburn | |
| 9,608,000 B2 | 3/2017 | Hopkins et al. | |
| 9,793,124 B2 | 10/2017 | Hopkins | |
| 9,960,045 B1 | 5/2018 | Purayath et al. | |
| 9,991,273 B2 | 6/2018 | Dennison et al. | |
| 10,014,311 B2 | 7/2018 | Pavlopoulos et al. | |
| 2004/0051126 A1* | 3/2004 | Cuchiaro | H01L 21/31604 257/295 |
| 2011/0083736 A1* | 4/2011 | Gentleman | C01F 17/241 428/141 |
| 2012/0058629 A1 | 3/2012 | You et al. | |
| 2013/0256775 A1* | 10/2013 | Shim | H01L 27/1158 257/314 |
| 2013/0320414 A1 | 12/2013 | Fan et al. | |
| 2014/0003148 A1 | 1/2014 | Sun et al. | |
| 2014/0160850 A1 | 6/2014 | Liu | |

(Continued)

*Primary Examiner* — Wael M Fahmy
*Assistant Examiner* — Quinton A Brasfield
(74) *Attorney, Agent, or Firm* — TraskBritt

(57) ABSTRACT

A semiconductor device comprises a semiconductor material extending through a stack of alternating levels of a conductive material and an insulative material, and a material comprising cerium oxide and at least another oxide adjacent to the semiconductor material. Related electronic systems and methods are also disclosed.

15 Claims, 10 Drawing Sheets

(56) References Cited

U.S. PATENT DOCUMENTS

| | | | |
|---|---|---|---|
| 2014/0193969 A1 | 7/2014 | Hull et al. | |
| 2014/0264542 A1 | 9/2014 | Simsek-Ege et al. | |
| 2015/0041879 A1* | 2/2015 | Jayanti | H01L 29/16 438/269 |
| 2015/0243671 A1* | 8/2015 | Simsek-Ege | H01L 27/11582 257/321 |
| 2015/0348984 A1* | 12/2015 | Yada | H01L 27/11524 257/326 |
| 2016/0093688 A1* | 3/2016 | Meldrim | H01L 29/7827 438/145 |
| 2016/0118071 A1* | 4/2016 | Hirotsune | G11B 5/3133 360/75 |
| 2017/0154895 A1 | 6/2017 | Huo | |
| 2019/0198519 A1* | 6/2019 | Economy | H01L 21/31144 |

* cited by examiner

SEMICONDUCTOR DEVICES AND ELECTRONIC SYSTEMS INCLUDING AN ETCH STOP MATERIAL, AND RELATED METHODS

TECHNICAL FIELD

Embodiments disclosed herein relate to semiconductor devices and electronic systems, and to related methods of forming semiconductor devices and electronic systems. More particularly, embodiments of the disclosure relate to semiconductor devices, such as NAND devices, including an etch stop material comprising an oxide of cerium and at least one of magnesium, aluminum, and hafnium, as well as to related devices, related electronic systems, and to related methods of forming semiconductor devices and electronic systems including the etch stop material.

BACKGROUND

Fabrication of semiconductor devices includes forming (e.g., patterning) one or more materials to have a desired size and spacing. For example, conductive materials may be patterned into conductive lines, such as access lines (e.g., word lines), digit lines (e.g., sense lines, bit lines), conductive contacts, and conductive traces. Other features may be patterned to form, for example, select devices of memory cells, memory storage elements, and other components of semiconductor devices.

To meet demands for higher capacity memories, designers continue to strive for increasing memory density, (i.e., the number of memory cells for a given area of an integrated circuit die). One way to increase memory density is to reduce the feature size of individual memory cells. However, as the feature size decreases, the thickness of different portions of a memory cell, such as a tunnel dielectric material, may also exhibit a similar decrease in size. A tunnel dielectric material having a low thickness may result in an increased risk of failure of the tunnel dielectric material and charge leakage from a storage node of the memory cell. Alternatively, memory density may be increased by stacking multiple tiers of memory arrays on top of one another. Another proposal for increasing memory density has been to form NAND arrays vertically around semiconductor pillars, which act as channel regions of NAND strings.

NAND arrays may be formed by stacking materials in a vertical dimension to form so-called "three-dimensional" semiconductor devices including stack structures. An etch stop material may be located under the stack structures to reduce or prevent removal of materials underlying the stack structures. As a height of the stack structures increases, materials of the stack structures may be exposed to etch chemistries for a longer duration throughout fabrication of the NAND strings. However, as the height of the stack structures increases, conventional etch stop materials may not be sufficient to prevent etching through of the etch stop material and undesired removal of materials underlying the etch stop material.

One method to overcome the shortcomings of conventional etch stop materials has been to increase a thickness of the etch stop material. However, increasing the thickness of the etch stop material may be costly and may also result in an undesired etch profile. For example, removal of etch stop materials having too large a thickness using anisotropic etchants may undesirably undercut portions of the etch stop material located in a region between adjacent NAND strings. Undercutting of the etch stop material may increase a likelihood of toppling of the materials of the stack structures located between adjacent NAND strings.

Another method of overcoming the shortcomings of conventional etch stop materials has been to use alternative materials, such as tungsten. However, removal of etch stop materials comprising tungsten may redeposit on portions of the NAND strings, leaving an undesired residue on the NAND strings. Yet another method includes forming the etch stop material as discrete plugs at suitable locations in a so-called "plug dry etch stop" integration scheme. However, formation of etch stop plugs requires separate patterning acts to form the pattern of etch stop plugs and is more costly than blanket deposition of an etch stop material.

DETAILED DESCRIPTION

Figure 1A:
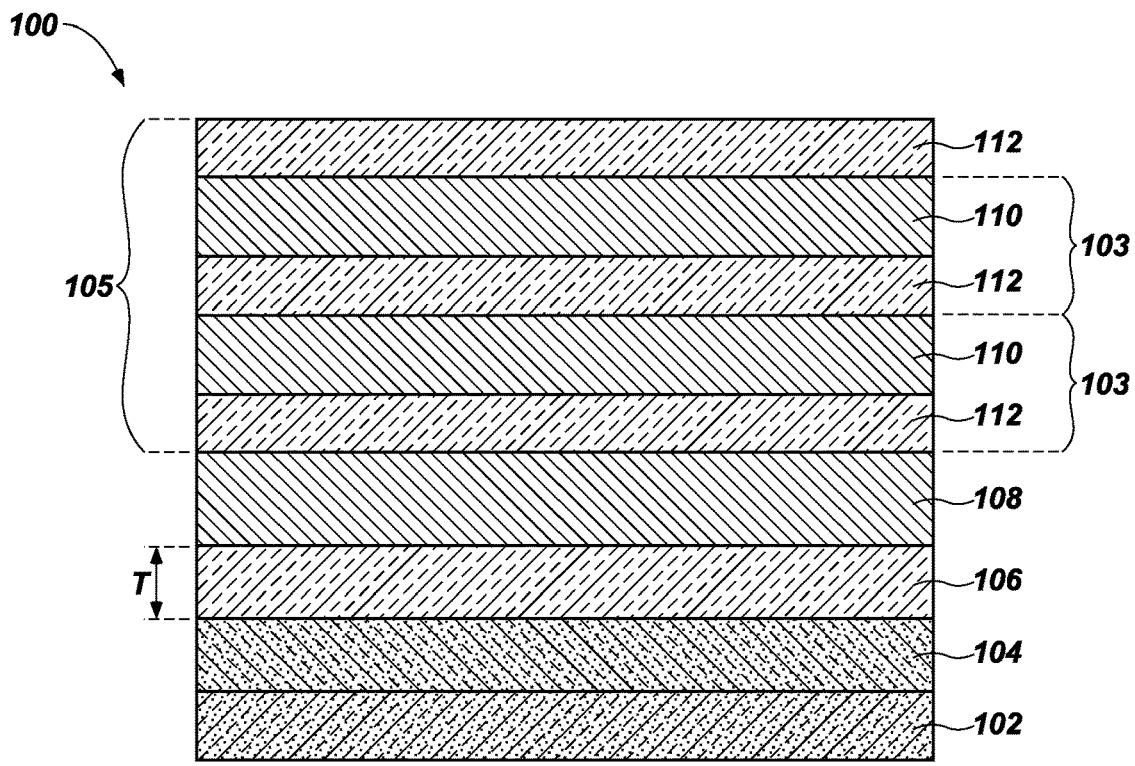
FIG. 1A through FIG. 1H are simplified cross-sectional views illustrating a method of forming a semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or an electronic system, a semiconductor device or electronic system including an etch stop material, or a complete description of a process flow for fabricating such semiconductor devices and electronic systems. The structures described below do not form complete semiconductor device structures. Only those process acts and structures necessary to understand the embodiments described herein are described in detail below. Additional acts to form a complete semiconductor device, an electronic system, or etch stop materials during fabrication of the semiconductor devices or electronic systems may be performed by conventional techniques.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

According to embodiments described herein, a semiconductor device comprises an etch stop material. The etch stop material may include an oxide of cerium and at least another oxide. The at least another oxide may include an oxide of one or more Group 2, Group 3, Group 4, Group 5, Group 13, or Group 14 elements of the Periodic Table. By way of nonlimiting example, the at least another oxide may include an oxide of one or more of magnesium, calcium, strontium, barium, yttrium, titanium, zirconium, hafnium, niobium, tantalum, aluminum, silicon, or combinations thereof. In some embodiments, the etch stop material comprises a combination of cerium oxide and magnesium oxide and may be represented as $CeMgO_x$, wherein x is between about, for example, 1.0 and about 2.0, depending on a ratio of cerium to magnesium. A molar percent of cerium oxide ($CeO_2$) to the at least another oxide may be tuned (e.g., tailored) to adjust the etch properties of the etch stop material. The etch stop material may be formulated and configured to exhibit a desirable etch rate responsive to exposure to a wet etch chemistry and formulated and configured such that the etch stop material is not removed (e.g., not substantially removed) responsive to exposure to a dry etch chemistry used to form other portions of the semiconductor device. In some embodiments, a semiconductor device may be fabricated by forming stack structures comprising alternating levels of a first material (e.g., an insulative material) and a second material (e.g., another insulative material, a conductive material) over the etch stop material. Portions of the stack structures may be removed using at least a first etch chemistry (e.g., a dry etch chemistry) to form openings extending through the stack structures to the etch stop material. The etch stop material may not be substantially removed responsive to exposure to the first etch chemistry. After forming the openings, the etch stop material may be exposed to a second etch chemistry (e.g., a wet etch chemistry) to selectively remove the etch stop material relative to other materials of the semiconductor device. Portions of the etch stop material between adjacent openings may remain in the semiconductor device. In some embodiments, one or more materials (e.g., a channel material) may be formed in the openings and in spaces from which the etch stop material was removed to form pillar structures.

The etch stop material may be formulated and configured to exhibit an etch selectivity with respect to other materials of the semiconductor device. By way of example only, the etch stop material may exhibit an etch rate that is at least 5 times less than or at least 10 times less than an etch rate of other materials exposed to the same etch chemistry and etch conditions. In addition, a composition of the etch stop material (e.g., a molar percent of cerium oxide relative to a molar percent of the at least another oxide) may be formulated to control a wet etch rate of the etch stop material responsive to exposure to a wet etchant. The resulting semiconductor devices may comprise pillar structures having substantially vertical sidewalls. The etch stop material may remain between adjacent pillar structures. The pillar structures may have an aspect ratio greater than about 30:1, such as greater than about 40:1, greater than about 50:1, greater than about 60:1, greater than about 70:1, greater than about 80:1, greater than about 90:1, greater than about 100:1, etc. The etch stop material may facilitate formation of openings, trenches, or other patterns having substantially vertical sidewalls and without etching through the etch stop material and undesirably removing portions of materials underlying the etch stop material.

FIG. 1A through FIG. 1H illustrate a method of forming a semiconductor device 100, in accordance with embodiments of the disclosure. FIG. 1A is a simplified cross-sectional view of a semiconductor device 100, in accordance with embodiments of the disclosure. The semiconductor device 100 may include a stack 105 including alternating levels of a conductive material 110 and an insulative material 112. For example, the semiconductor device 100 may include tiers 103, each tier comprising a conductive material 110 and an insulative material 112.

Although FIG. 1A illustrates that the semiconductor device 100 includes only two tiers 103, the disclosure is not so limited. The semiconductor device 100 may include more than at least about 32 tiers 103 or alternating levels of conductive material and insulative material 112, such as at least about 64 tiers, at least about 128 tiers, or even at least about 256 tiers. In some embodiments, an uppermost conductive material 110 may be configured as a select gate drain, although the disclosure is not so limited.

In some embodiments, the stack 105 is formed over a base material 102, such as a semiconductor substrate. The base material 102 may be a base material or a construction upon which additional materials are formed. The base material 102 may be a semiconductor substrate, a base semiconductor layer on a supporting structure, a metal electrode or a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

A source 104, such as a source region, may overlie the base material 102. An etch stop material 106 may overlie the source 104 and a conductive material 108 may overlie the etch stop material 106. The stack 105 comprising the alternating levels of the conductive material 110 and the insulative material 112 may overlie the conductive material 108. For clarity, the relative dimensions of the base material 102, source 104, etch stop material 106, and conductive material 108 are exaggerated and are not drawn to scale.

The source 104 may include, for example, a semiconductor material doped with one of P-type conductivity materials or N-type conductivity materials. As used herein, an N-type conductivity material may include, for example, polysilicon doped with at least one N-type dopant (e.g., arsenic ions, phosphorous ions, antimony ions). The P-type channel region 310b of the vertical NMOS transistor 310 may be formed of and include at least one P-type conductivity material. As used herein, a P-type conductivity material may include, for example, polysilicon doped with at least one P-type dopant (e.g., boron ions). In some embodiments, the source 104 includes N-type conductivity materials. In other embodiments, the source 104 comprises doped polysilicon, tungsten silicide, or another material.

The conductive material 108 may comprise a so-called select gate source material. The conductive material 108 may include an electrically conductive material, such as polysilicon (e.g., P-type polysilicon), or another material. In some embodiments, the conductive material 108 has the same composition as the conductive material 110.

The etch stop material 106 may electrically isolate the source 104 from the conductive material 108. The etch stop material 106 may be formulated and configured to exhibit an etch selectivity with respect to the materials of the stack 105 (e.g., with respect to the conductive material 110 and the insulative material 112). As will be described herein, portions of the conductive material 110 and the insulative material 112 may be removed without substantially removing the etch stop material 106.

The etch stop material 106 may have a thickness T from about 10 nm to about 100 nm, such as from about 10 nm to about 20 nm, from about 20 nm to about 40 nm, from about 40 nm to about 60 nm, from about 60 nm to about 80 nm, or from about 80 nm to about 100 nm. However, the disclosure is not so limited and the thickness T may be different than described above.

The etch stop material 106 may comprise a substantially continuous material extending between the source 104 and the conductive material 108. In other words, the etch stop material 106 may not include discontinuities therein and may be formed by, for example, blanket deposition over the source 104. Stated another way, the etch stop material 106 may be substantially co-extensive with the source 104.

The etch stop material 106 may comprise a material that may not be substantially removed responsive to exposure to various dry etchants to which the semiconductor device 100 may be exposed, such as during formation of openings through the stack 105. In other words, the etch stop material 106 may not be removed responsive to exposure to various etch chemistries used to form openings through the conductive material 110 and the insulative material 112.

In some embodiments, the etch stop material 106 includes a first material and at least a second material. In some embodiments, the first material comprises an oxide material and the at least a second material comprises at least a second (e.g., another) oxide material. The first material may comprise cerium oxide ($CeO_2$). The at least a second material may comprise an oxide of one or more Group 2 (e.g., beryllium, magnesium, calcium, strontium, barium), Group 3 (e.g., scandium, yttrium, lanthanum), Group 4 (e.g., titanium, zirconium, hafnium), or Group 5 (e.g., vanadium, niobium, tantalum) element of the Periodic Table, one or more of a Group 13 elements (e.g., aluminum), a Group 14 element (e.g., silicon), or combinations thereof. By way of nonlimiting example, the at least a second material may comprise magnesium oxide (MgO), calcium oxide (CaO), strontium oxide (SrO), barium oxide (BaO), yttrium oxide ($Y_2O_3$), titanium dioxide ($TiO_2$), zirconium oxide ($ZrO_2$), hafnium oxide ($HfO_2$), niobium oxide ($Nb_2O_5$), tantalum oxide ($Ta_2O_5$), aluminum oxide ($Al_2O_3$), silicon dioxide ($SiO_2$), or combinations thereof. In some embodiments, the first material (e.g., $CeO_2$) and the at least a second material each comprise a stoichiometric composition. In other words, the first material and the at least a second material may not include oxygen vacancies.

In some embodiments, the etch stop material 106 includes cerium oxide and magnesium oxide and may comprise, for example $CeMgO_x$, wherein x is a value between about 1.0 and about 2.0, depending on the molar ratio of $CeO_2$ to MgO. In some embodiments, the etch stop material 106 comprises $CeO_2$:MgO, which does not necessarily imply one part $CeO_2$ per one part MgO. In yet other embodiments, the etch stop material 106 includes cerium oxide, magnesium oxide, and at least another oxide (e.g., at least one of calcium oxide, strontium oxide, barium oxide, yttrium oxide, titanium dioxide, zirconium oxide, hafnium oxide, niobium oxide, tantalum oxide, aluminum oxide, silicon dioxide, or combinations thereof. In some embodiments, the etch stop material 106 comprises hafnium magnesium oxide ($HfMgO_x$), hafnium cerium oxide ($HfCeO_x$), aluminum cerium oxide ($AlCeO_x$), hafnium magnesium cerium oxide ($HfMgCeO_x$), aluminum magnesium cerium oxide ($AlMgCeO_x$), hafnium aluminum cerium oxide ($HfAlCeO_x$), wherein x is between about 1.0 and about 3.0, or combinations thereof.

A composition of the etch stop material 106 may be tailored depending on the materials of different components of the semiconductor device 100, such as a composition of the conductive material 110 and the insulative material 112. A molar percent of the first material in the etch stop material 106 may range from about 20.0 molar percent to about 60.0 molar percent, such as from about 20.0 molar percent to about 30.0 molar percent, from about 30.0 molar percent to about 40.0 molar percent, from about 40.0 molar percent to about 50.0 molar percent, or from about 50.0 molar percent to about 60.0 molar percent. In some embodiments, the molar percent of the first material in the etch stop material 106 ranges from about 27.5 molar percent to about 57.5 molar percent.

A molar percent of the second material of the etch stop material 106 may range from about 40.0 molar percent to about 80.0 molar percent, such as from about 40.0 molar percent to about 50.0 molar percent, from about 50.0 molar percent to about 60.0 molar percent, from about 60.0 molar percent to about 70.0 molar percent, or from about 70.0 molar percent to about 80.0 molar percent. In some embodiments, the molar percent of the second material in the etch stop material ranges from about 42.5 molar percent to about 72.5 molar percent. In some embodiments, the molar percent of the first material is about 42.5 molar percent and the molar percent of the second material is about 57.5 molar percent.

In some embodiments, a composition of the etch stop material 106 may be substantially uniform throughout the thickness of the etch stop material 106. In other words, in some such embodiments, the etch stop material 106 may not exhibit a gradient of the composition thereof. However, the disclosure is not so limited and, in at least some embodiments, the etch stop material 106 may exhibit a non-uniform composition.

The etch stop material 106 may be formed by, for example, atomic layer deposition (ALD), physical vapor deposition (PVD), chemical vapor deposition (CVD), plasma enhanced chemical vapor deposition (PECVD), low pressure chemical vapor deposition (LPCVD), another deposition method, or combinations thereof.

In some embodiments, the etch stop material 106 is formed by PVD. By way of nonlimiting example, the etch stop material 106 may be formed by PVD using a single target having the composition of the etch stop material 106. In some such embodiments, the target may comprise the first material and the second material, such as cerium oxide and at least one of magnesium oxide, aluminum oxide, or hafnium oxide. In some embodiments, the target comprises from about 20.0 molar percent and about 60.0 molar percent of cerium oxide and from about 40.0 molar percent to about 80.0 molar percent of magnesium oxide.

In other embodiments, the etch stop material 106 may be formed using more than one target, such as a first target comprising the first material and a second target comprising the at least a second material. In some such embodiments, a composition of the etch stop material 106 may be controlled based on the energy at which the first target and the second target are bombarded.

Figure 1B:
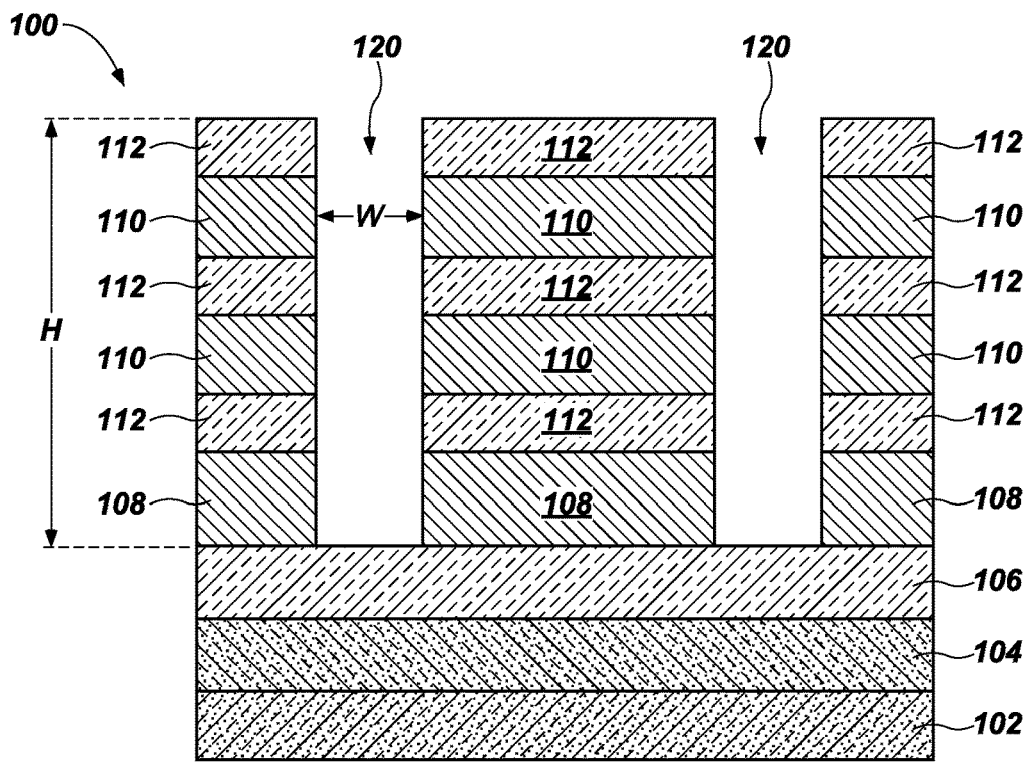

Referring to FIG. 1B, openings 120 may be formed in the semiconductor device 100 through the stack 105 and through at least a portion of the conductive material 108. In some embodiments, the openings 120 may extend to the etch stop material 106 and the etch stop material 106 may be exposed through the openings 120.

The openings 120 may be formed by removing portions of the alternating levels of the conductive material 110 and the insulative material 112. In some embodiments, the openings 120 are formed by exposing the semiconductor device 100 to a dry etchant, such as an ion bombardment, a reactive ion etching (RIE) process, another dry etching process, or combinations thereof. In some embodiments, the openings 120 are formed by exposing the semiconductor device 100 to ion bombardment.

By way of nonlimiting example, the openings 120 may be formed by exposing the semiconductor device 100 to a dry etchant comprising at least one fluorinated gas, and a carbon-containing gas, a nitrogen-containing gas, a chlorine-containing gas, oxygen, or combinations thereof. By way of nonlimiting example, the dry etchant may include a noble gas (e.g., Ar), $O_2$, $CO_2$, CO, $N_2O$, $NO_2$, $O_3$, $H_2O$, $N_2$, $NH_3$, HCl, $Cl_2$, $CCl_4$, $CHCl_3$, $CH_2Cl_2$, $CH_3Cl$, $CH_4$, $C_2H6$, $C_2H_4$, another gas, or combinations thereof. In some embodiments, the openings 120 may be formed and the dry etch stop material 106 may be exposed through the openings 120. The dry etch stop material 106 may not be substantially removed responsive to exposure to the dry etchant.

The openings 120 may have an aspect ratio, defined as a ratio of a height H thereof to a width W thereof, from about 10:1 to about 200:1. For example, the aspect ratio may range from 10:1 to about 20:1, from about 20:1 to about 30:1, from about 30:1 to about 50:1, from about 50:1 to about 100:1, from about 100:1 to about 150:1, or from about 150:1 to about 200:1. In some embodiments, the aspect ratio is greater than about 30:1.

The height H may be greater than about 3 μm, such as greater than about 4 μm, greater than about 5 μm, greater than about 10 μm, or even greater than about 20 μm. However, the disclosure is not so limited, and the height H may be different than those described above.

Figure 1C:
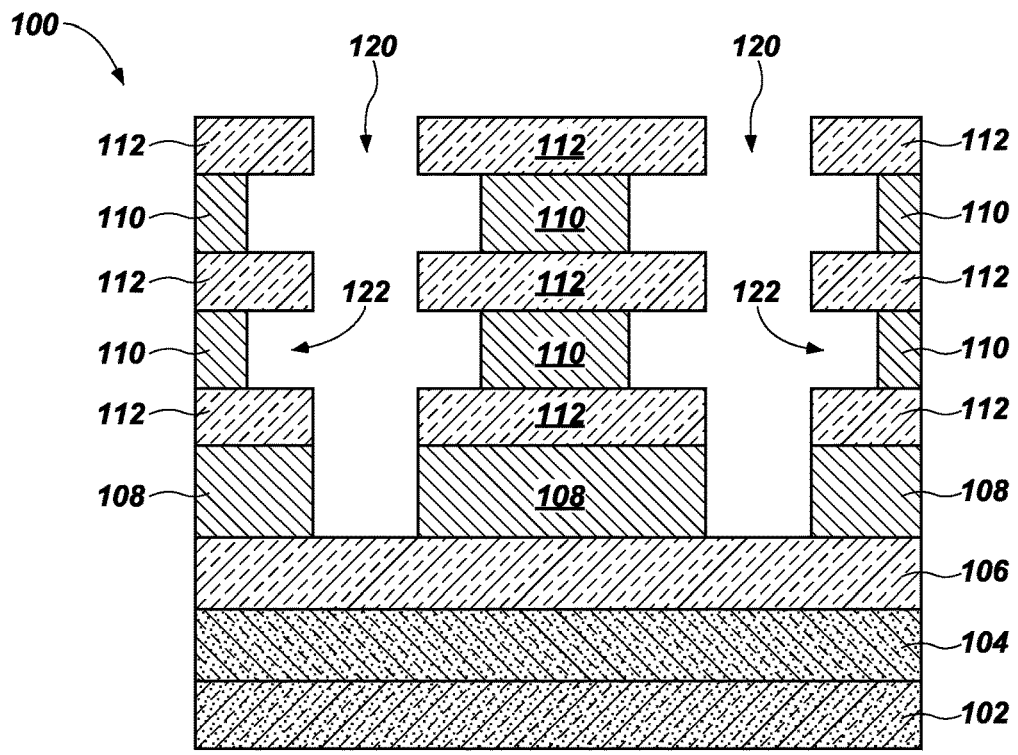

Referring to FIG. 1C, after forming the openings 120, portions of the conductive material 110 may be removed to form recessed portions 122. The conductive material 110 may be removed selectively with respect to the insulative material 112 and to the etch stop material 106 to form the recessed portions 122. The recessed portions 122 may be formed by laterally removing portions of the conductive material 110. After removing portions of the conductive material 110, portions of the insulative material 112 may extend laterally beyond the remaining portions of the conductive material 110. In some embodiments, portions of the conductive material 110 and the recessed portions 122 may be formed by exposing the semiconductor device 100 to a wet etchant, such as a solution of tetramethylammonium hydroxide (TMAH). In some embodiments, exposing the semiconductor device 100 to the wet etchant may not substantially remove the etch stop material 106.

Figure 1D:
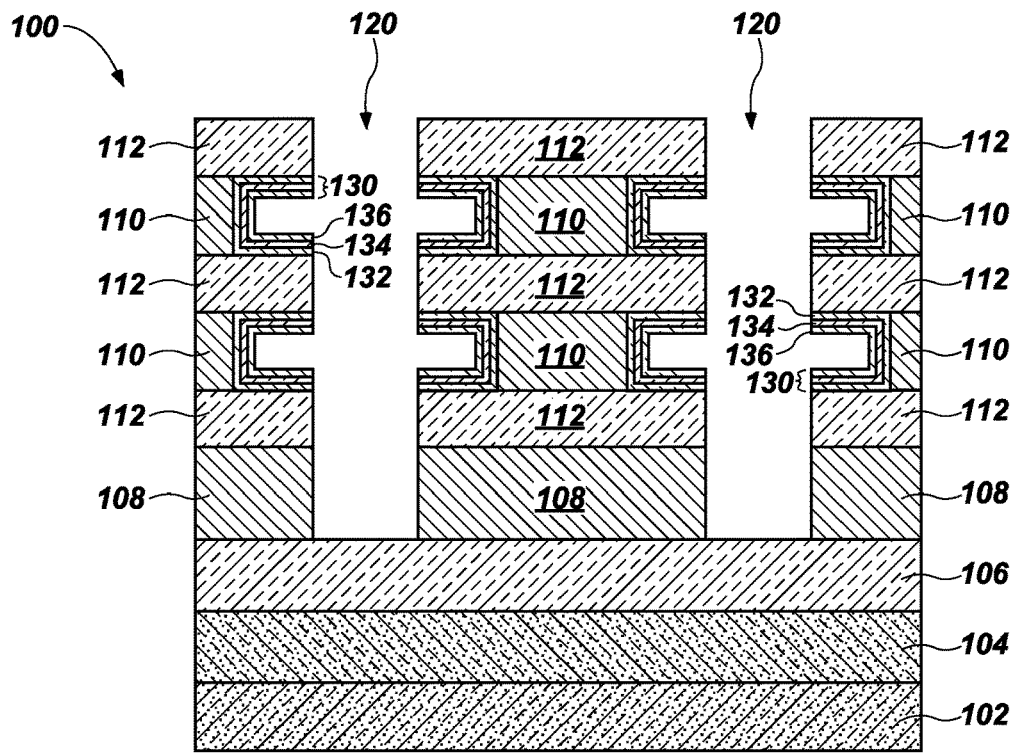

FIG. 1D illustrates the semiconductor device 100 after forming a charge storage material 130 which may include, for example, a first dielectric material 132, a second dielectric material 134 adjacent the first dielectric material 132, and a third dielectric material 136 adjacent to the second dielectric material 134. Portions of the charge storage material 130 on sidewalls of the insulative material 112 between adjacent conductive materials 110 may be removed such that the charge storage material 130 is located only within the recessed portions 122.

The second dielectric material 134 may be located between the first dielectric material 132 and the third dielectric material 136. In some embodiments, the first dielectric material 132 and the third dielectric material 136 comprise an oxide material and the second dielectric material 134 comprises a nitride material. By way of nonlimiting example, the first dielectric material 132 and the third dielectric material 136 may comprise silicon dioxide and the second dielectric material 134 may comprise silicon nitride. In some such embodiments, the charge storage material 130 may comprise a so-called oxide-nitride-oxide (ONO) structure. In some embodiments, the charge storage material 130 may also be referred to as an interpoly dielectric (IPD) material.

Although FIG. 1D illustrates the charge storage material 130 only in the recessed portions 122 (FIG. 1C) the disclosure is not so limited. In other embodiments, the charge storage material 130, or at least a portion thereof (e.g., the second dielectric material 134, the third dielectric material 136) may extend conformally along sidewalls of the openings 120 and the recessed portions 122 (FIG. 1C).

Figure 1E:
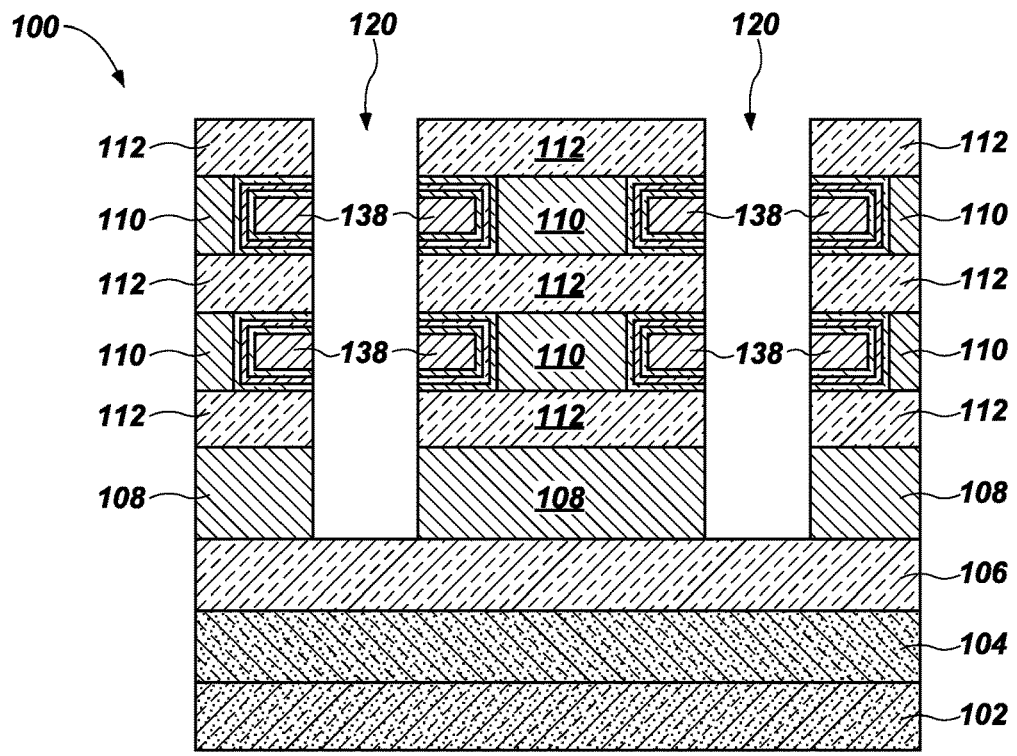

Referring to FIG. 1E, a floating gate material 138 may be formed within the openings 120, such as within the recessed portions 122 (FIG. 1C). Portions of the floating gate material 138 located on sidewalls of the insulative material 112 may be removed. The floating gate material 138 may be separated from the adjacent conductive material 110 by the charge storage material 130. In other words, the charge storage material 130 may be located between the floating gate material 138 and the conductive material 110.

The floating gate material 138 may include an electrically conductive material. By way of nonlimiting example, the floating gate material 138 may include a conductively-doped semiconductor material (e.g., conductively-doped silicon, conductively-doped germanium, conductively-doped silicon germanium, etc.), polysilicon, one or more of a metal, such as tungsten, titanium, cobalt, rhodium, ruthenium, nickel, platinum, ruthenium, aluminum, copper, molybdenum, iridium, gold, or combinations thereof, a metal alloy, a metal-containing material (e.g., metal nitrides, metal silicides, metal carbides, metal oxides), titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, or combinations thereof, one or more other electrically conductive materials, or combinations thereof.

In some embodiments, the floating gate material 138 comprises polysilicon. In some such embodiments, the polysilicon may be doped and may comprise, for example, n-doped polysilicon or p-doped polysilicon.

Figure 1F:
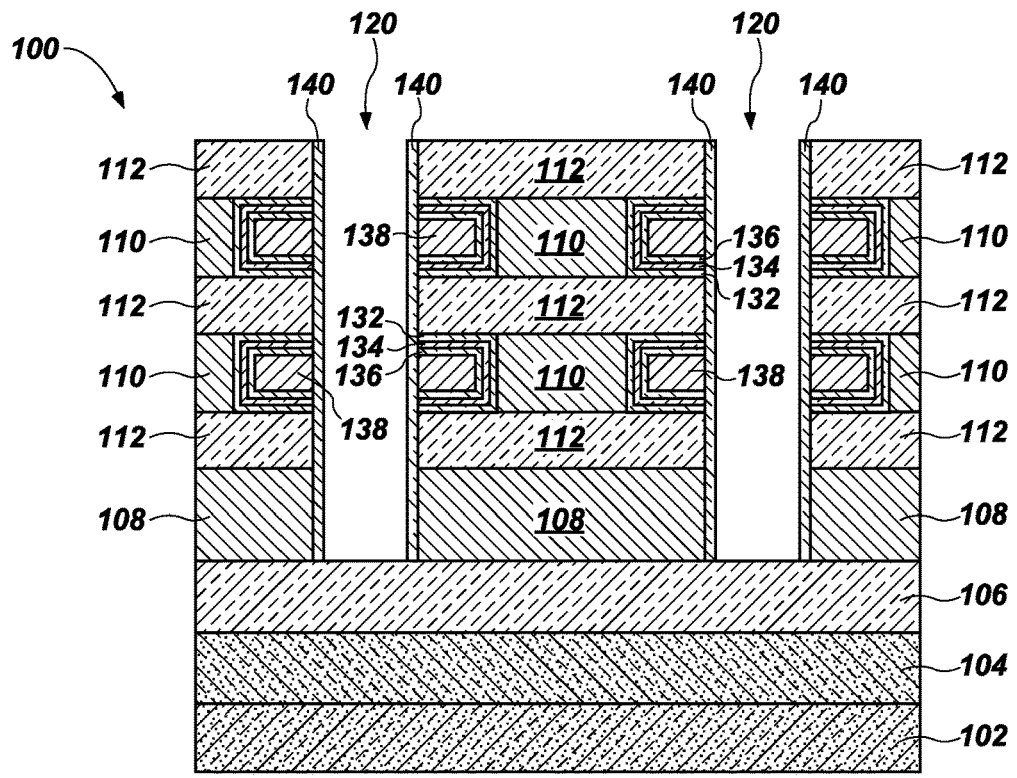

FIG. 1F illustrates the semiconductor device 100 after a tunnel dielectric material 140 is formed over sidewalls of the opening 120 and over sides of the floating gate material 138. After forming the tunnel dielectric material 140, portions of the tunnel dielectric material 140 on a lower portion of the opening 120 over surfaces of the etch stop material 106 may be removed to expose portions of the etch stop material 106 through the openings 120.

The tunnel dielectric material 140 may include, for example, a tunnel oxide. In some embodiments, the tunnel dielectric material 140 comprises silicon dioxide. Although FIG. 1F illustrates the tunnel dielectric material 140 extending through the entire opening 120, the disclosure is not so limited. In other embodiments, the tunnel dielectric material 140 may be located only on sides of the floating gate material 138. In some embodiments, the tunnel dielectric material 140 may be grown on the floating gate material 138, such as by an in-situ steam generation (ISSG) process to selectively oxidize exposed portions of the floating gate material 138.

Figure 1G:
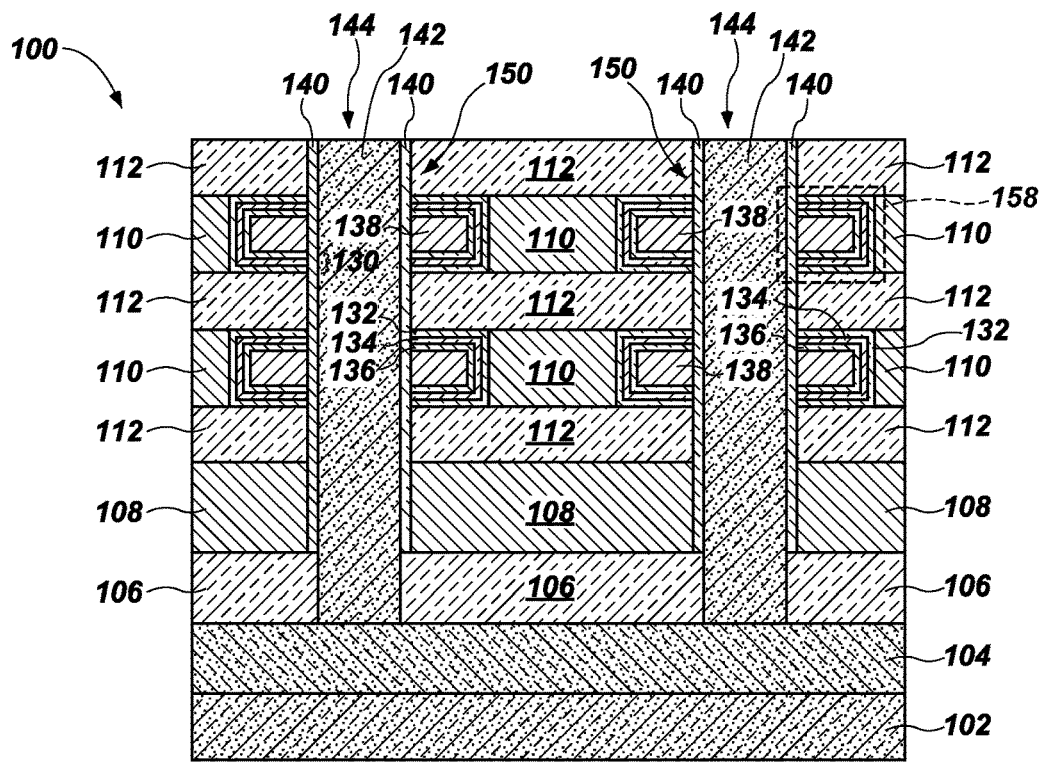

Referring to FIG. 1G, portions of the etch stop material 106 may be removed to expose portions of the source 104. In some embodiments, the etch stop material 106 is removed with a wet etchant that is selective to the etch stop material 106 and does not substantially remove exposed portions of the semiconductor device 100. For example, the etch stop material 106 may be removed without substantially removing portions of the insulative material 112 or the tunnel dielectric material 140. The wet etchant may include, for example, hydrofluoric acid, phosphoric acid, another acid, or combinations thereof.

After removing the etch stop material 106, the openings 120 may be filled with a channel material 142 to form pillars 144 of the channel material 142. The channel material 142 may include a semiconductor material, such as, for example, polysilicon. In some embodiments, the channel material 142 comprises P-type polysilicon. In other embodiments, the channel material 142 comprises an electrically conductive material such as, for example, a metal oxide semiconductor material. In some embodiments, the channel material 142 comprises polysilicon.

The channel material 142 may form strings 150 of individual memory cells 158 (shown in dashed box). The memory cells 158 may include the conductive material 110, the charge storage material 130, the floating gate material 138, the tunnel dielectric material 140, and the channel material 142.

Figure 1H:
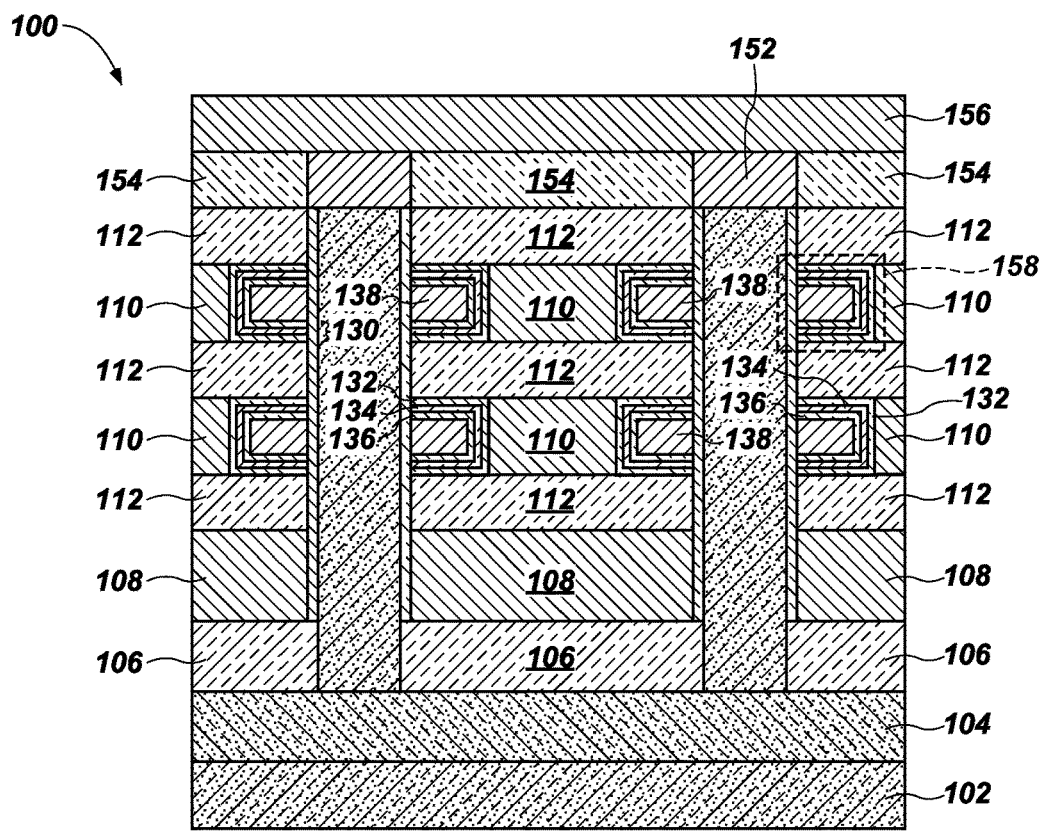

With reference to FIG. 1H, an insulative material 154 may be formed over the semiconductor device 100. The insulative material 154 may be patterned and conductive plugs 152 may be formed over and in electrical communication with the channel material 142. A data line (e.g., bit line) 156 may be formed over the conductive plugs 152.

Although FIG. 1A through FIG. 1H have been described and illustrated as removing portions of the etch stop material 106 after forming the charge storage material 130, the disclosure is not so limited. In other embodiments, portions of the etch stop material 106 may be removed to expose portions of the source 104 after forming the openings 120 and prior to forming the charge storage material 130, such as prior to forming the recessed portions 122 (FIG. 1C).

Although FIG. 1A through FIG. 1H have been described as including the etch stop material 106 between the source 104 and the conductive material 108, the disclosure is not so limited. In other embodiments, the etch stop material 106 may be located between, for example, the conductive material 108 and the insulative material 112.

Without wishing to be bound by any particular theory, it is believed that the etch stop material 106 having the composition described above may facilitate forming the strings 150 having an aspect ratio greater than at least about 30:1. In some embodiments, the etch stop material 106 may facilitate forming the semiconductor device 100 to include more than at least about 32 tiers 103 (FIG. 1A) of alternating levels of the conductive material 110 and the insulative material 112, such as at least about 64 tiers 103, or even at least about 128 tiers 103. By way of comparison, semiconductor devices including tiers and formed according to conventional methods and with conventional etch stop materials may not be formed with a desired aspect ratio or with a desired profile of the semiconductor material. It is believed that, the etch stop material 106 is not removed responsive to exposure to dry etch chemistries used to form the openings 120 since the etch stop material 106 comprises materials having a high cohesive energy and strong ionic bonding (e.g., MgO, CeO$_2$, etc.). In other words, the strong ionic bonding of the etch stop material 106 may reduce a likelihood of removal of the etch stop material responsive to exposure to various dry etch chemistries and processes (e.g., ion bombardment).

It is believed that forming the etch stop material 106 to include a first material and at least a second material facilitates formulating the etch stop material 106 to exhibit desired properties with respect to dry etch chemistries and wet etch chemistries. For example, the etch stop material 106 may include the first material that is not substantially removed responsive to exposure to a dry etch chemistry. The etch stop material 106 may further include the second material that is not substantially removed responsive to exposure to the dry etch chemistry, but that may be removed responsive to exposure to the wet etch chemistry. Since the etch stop material 106 includes a uniform composition of the first material and the second material, the etch stop material 106 may be removed responsive to exposure to the wet etchant. Accordingly, a wet etch rate of the etch stop material 106 may be tailored based on a composition of the etch stop material 106, such as on the molar ratio of the first material to the at least a second material. By using a combination of the first material and second material, the etch stop material 106 may exhibit good dry etch properties and reasonable wet etch properties. In addition, the etch stop material 106 comprises a low cost material that may be formed as a continuous structure in a single act, such as by PVD, which may be less expensive than formation of other etch stop materials.

Although FIG. 1A through FIG. 1H have been described with respect to a method of forming the semiconductor device by a so-called floating gate method wherein the stack 105 (FIG. 1A) includes alternating levels of the conductive material 110 and the insulative material 112 and the floating gate material 138 (FIG. 1E) is formed proximate the conductive material 110, the disclosure is not so limited. In other embodiments, a semiconductor device may be formed by a so-called "replacement gate" process.

Figure 2A:
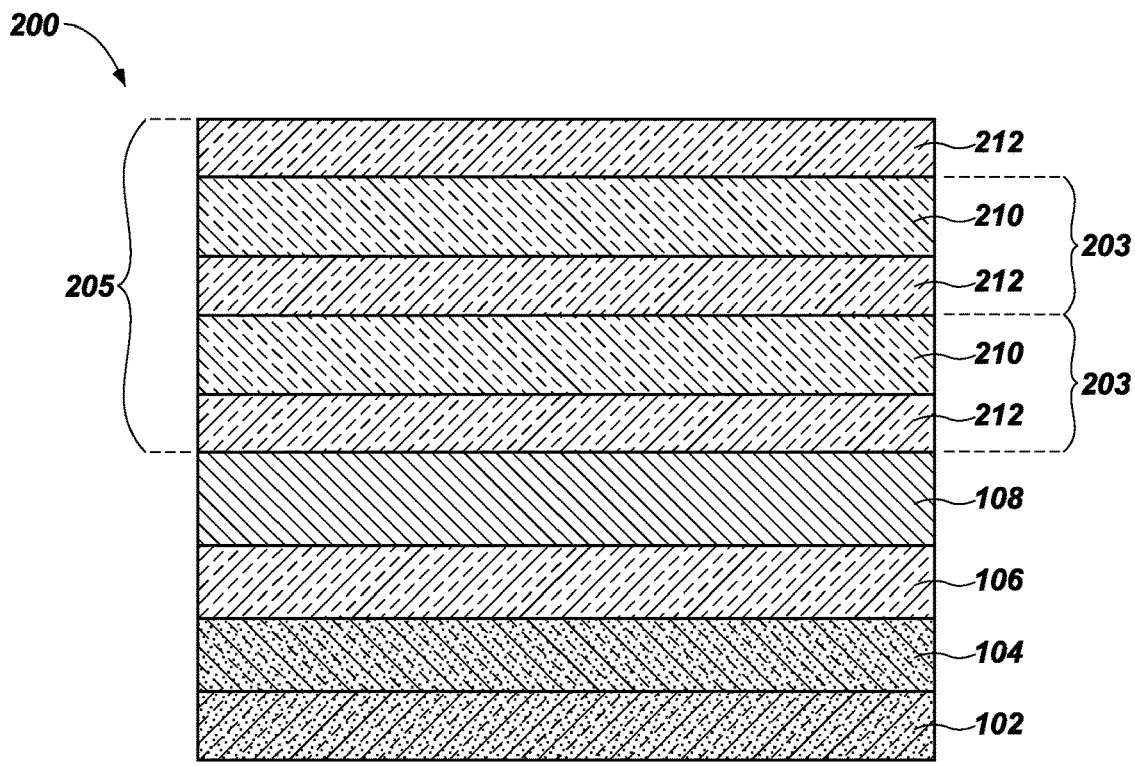
FIG. 2A through FIG. 2H are simplified cross-sectional views illustrating a method of forming a semiconductor device, in accordance with other embodiments of the disclosure.

FIG. 2A through FIG. 2H illustrate a method of forming another semiconductor device 200, in accordance with embodiments of the disclosure. With reference to FIG. 2A, a semiconductor device 200 may include the base material 102, the source 104 over the base material 102, the etch stop material 106 over the source 104, and the conductive material 108 over the etch stop material 106, as described above with reference to FIG. 1A. A stack 205 of tiers 203 comprising alternating levels of a first insulative material 210 and a second insulative material 212 may overlie the conductive material 108.

The first insulative material 210 and the second insulative material 212 may comprise materials exhibiting an etch selectivity with respect to each other. In other words, the first insulative material 210 and the second insulative material 212 may be formulated and configured such that one of the first insulative material 210 and the second insulative material 212 are not removed responsive to exposure to one or more chemistries that remove the other of the first insulative material 210 and the second insulative material 212. In some embodiments, the first insulative material 210 comprises a nitride material and the second insulative material 212 comprises an oxide material. In some embodiments, the first insulative material 210 comprises silicon nitride and the second insulative material 212 comprises silicon dioxide.

Figure 2B:
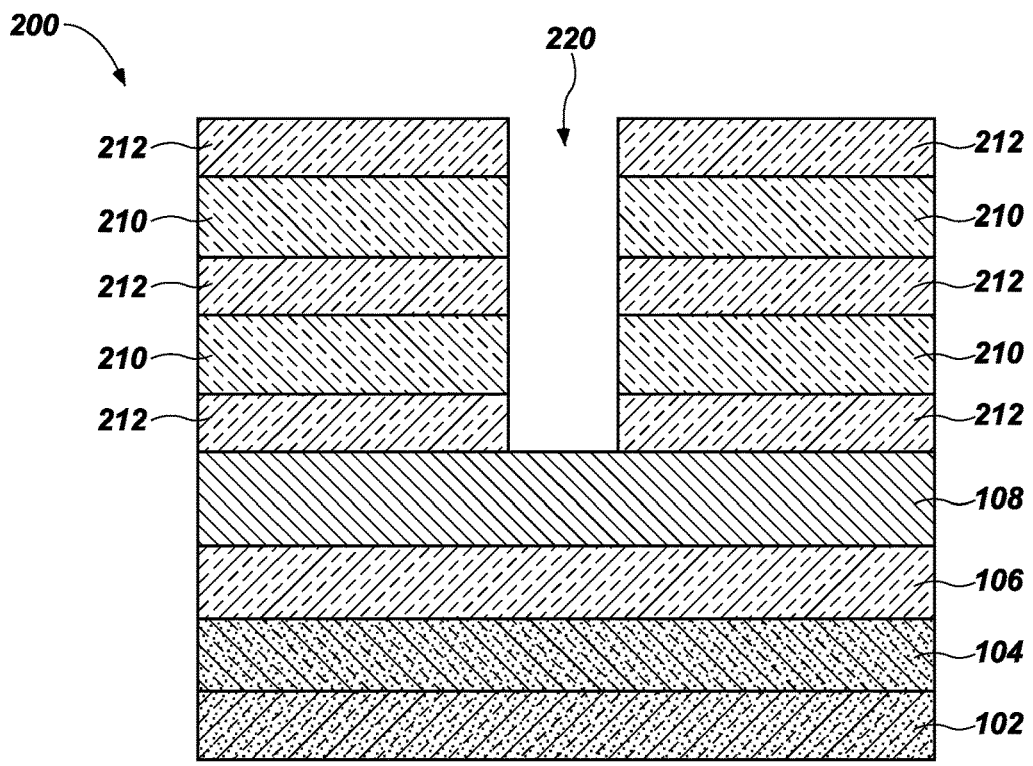

Referring to FIG. 2B, an opening 220 may be formed through the stack 205 (FIG. 2A). The opening 220 may be formed by exposing the semiconductor device 200 to, for example, a dry etch chemistry, as described above with reference to FIG. 1B and formation of the openings 120.

Figure 2C:
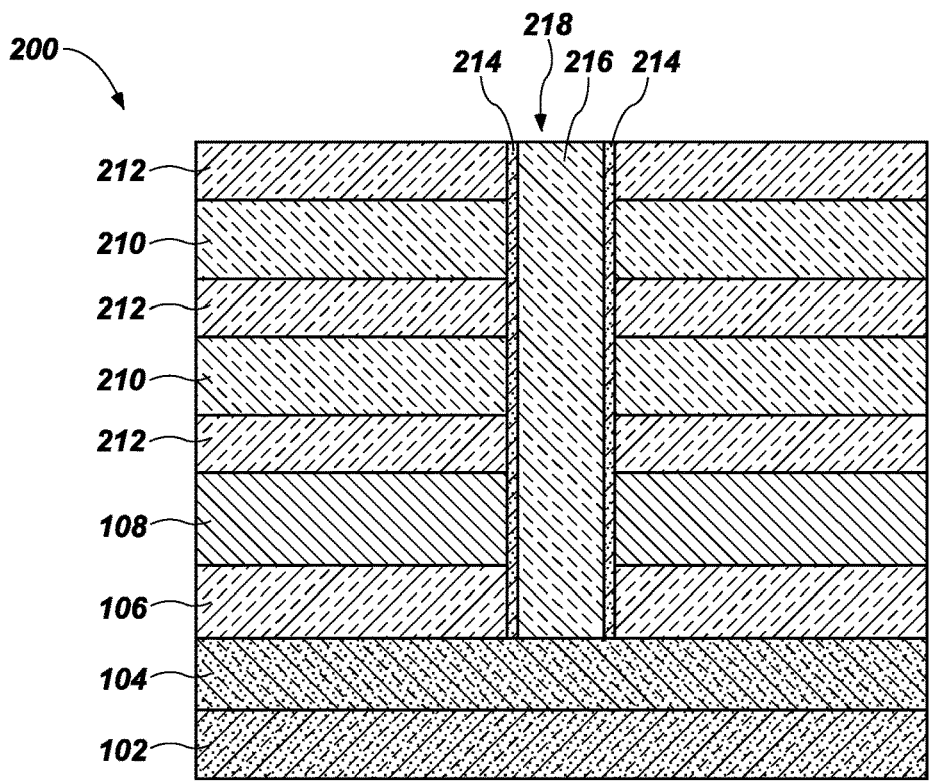

Referring to FIG. 2C, after removing portions of the first insulative material 210 and the second insulative material 212, portions of the conductive material 108 and the etch stop material 106 may be removed through the opening 220.

The etch stop material 106 may be removed with, for example, a wet etch chemistry, as described above with reference to FIG. 1G. In some embodiments, removal of the portions of the etch stop material 106 may not substantially remove the first insulative material 210, the second insulative material 212, or the conductive material 108.

After removing the portions of the etch stop material 106, a channel material 214 may be formed on at least sidewalls of the opening 220 (FIG. 2B). The channel material 214 may extend to the source 104 and may be in electrical contact with the source 104. The channel material 214 may comprise, for example, polysilicon, which may be doped.

In some embodiments, an insulative material 216 may be formed within remaining portions of the opening 220 between adjacent portions of the channel material 214. In other embodiments, the channel material 214 may fill the opening 220. The channel material 214 and the insulative material 216 may comprise pillars 218 extending through the stack 205.

Figure 2D:
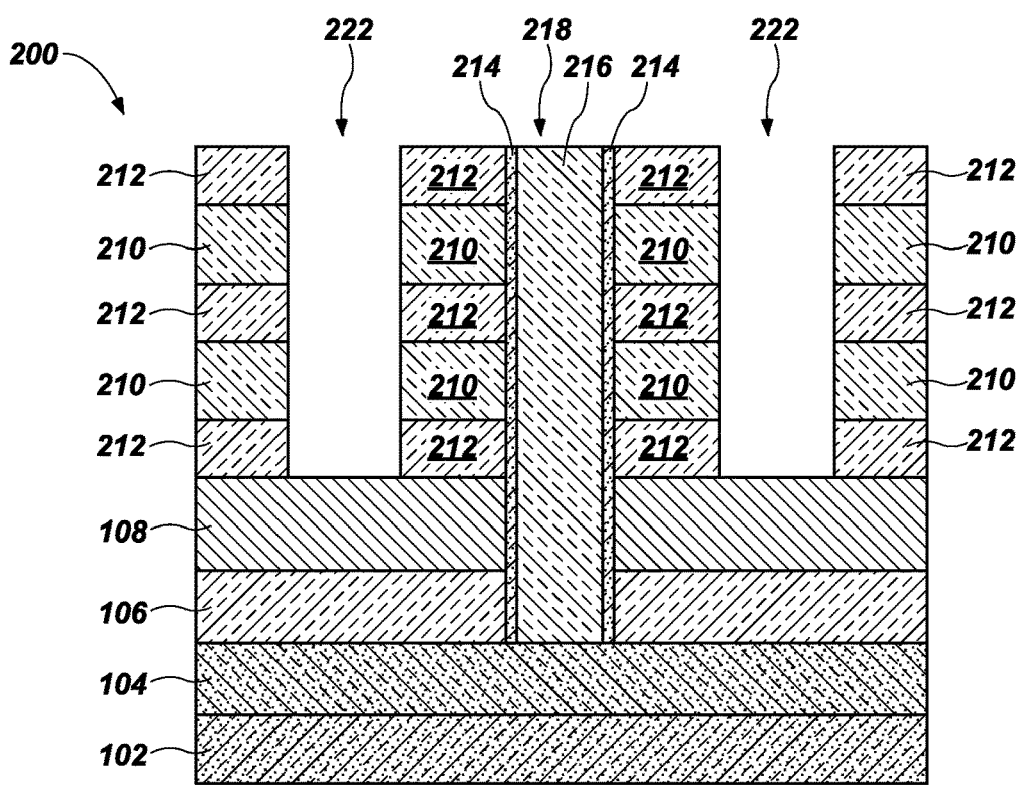
Figure 2E:
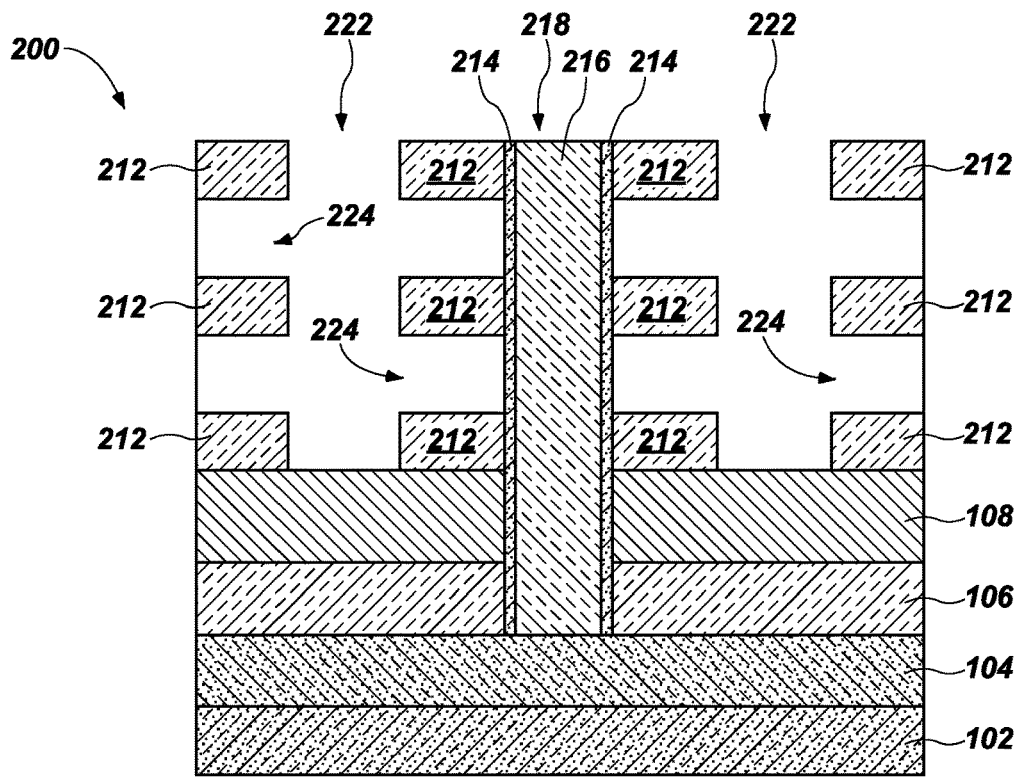

After forming the channel material 214, openings 222 may be formed through other portions of the stack 205 (FIG. 2A), as illustrated in FIG. 2D. The openings 222 may also be referred to herein as "slits." With reference to FIG. 2E, the first insulative material 210 may be removed through the openings 222. In some embodiments, the semiconductor device 200 is exposed to a wet etchant comprising, for example, phosphoric acid. Removal of the first insulative material 210 may form recesses 224. In some embodiments, the first insulative material 210 may be removed, such as by exposing the first insulative material 210 to a dry etchant comprising chlorine, oxygen, nitrous oxide, tetrafluoromethane, sulfur tetrafluoride, ($SF_4$), carbon dioxide, fluoromethane ($CH_3F$), nitrogen trifluoride ($NF_3$), sulfur hexafluoride ($SF_6$), or combinations thereof. In other embodiments, the first insulative material 210 may be removed by exposing the first insulative material to a wet etchant comprising, for example, phosphoric acid, hydrofluoric acid, or a combination thereof.

Figure 2F:
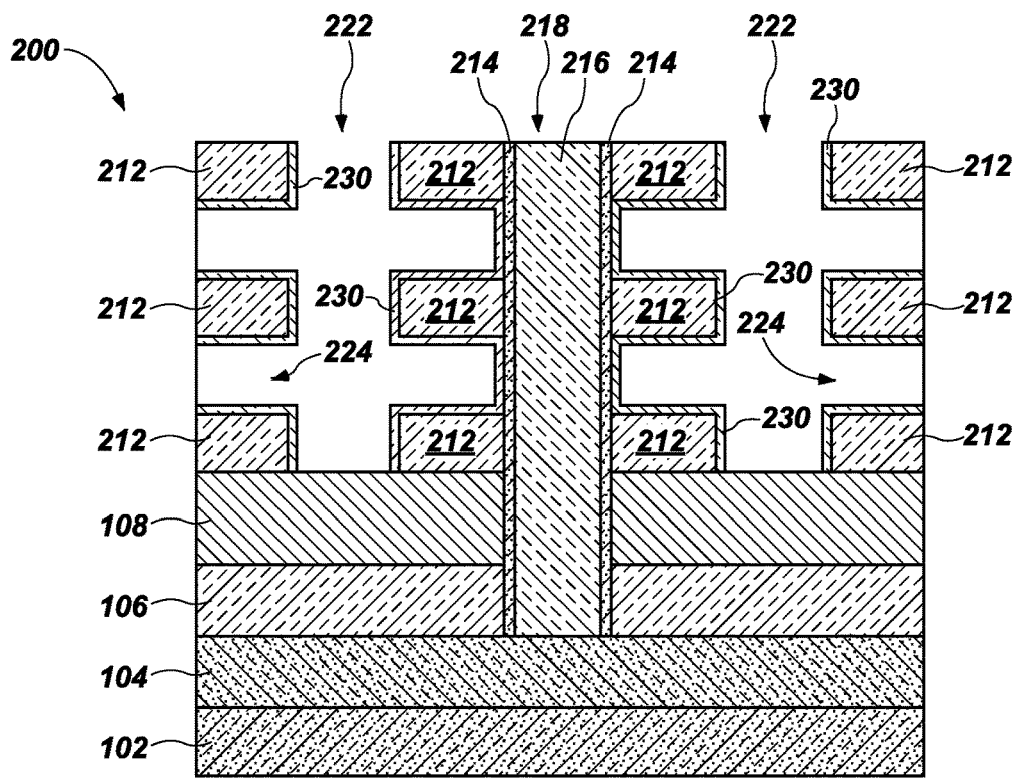

Referring to FIG. 2F, after removing the first insulative material 210, a charge storage material 230 may be formed at least within the recesses 224. In some embodiments, the charge storage material 230 may be formed along sidewalls of the second insulative material 212. In other embodiments, the charge storage material 230 may be removed from surfaces of the second insulative material 212 that do not face the recesses 224. The charge storage material 230 may be substantially the same as the charge storage material 130 described above with reference to FIG. 1D. In some embodiments, the charge storage material 230 comprises an oxide-nitride-oxide (ONO) structure.

Figure 2G:
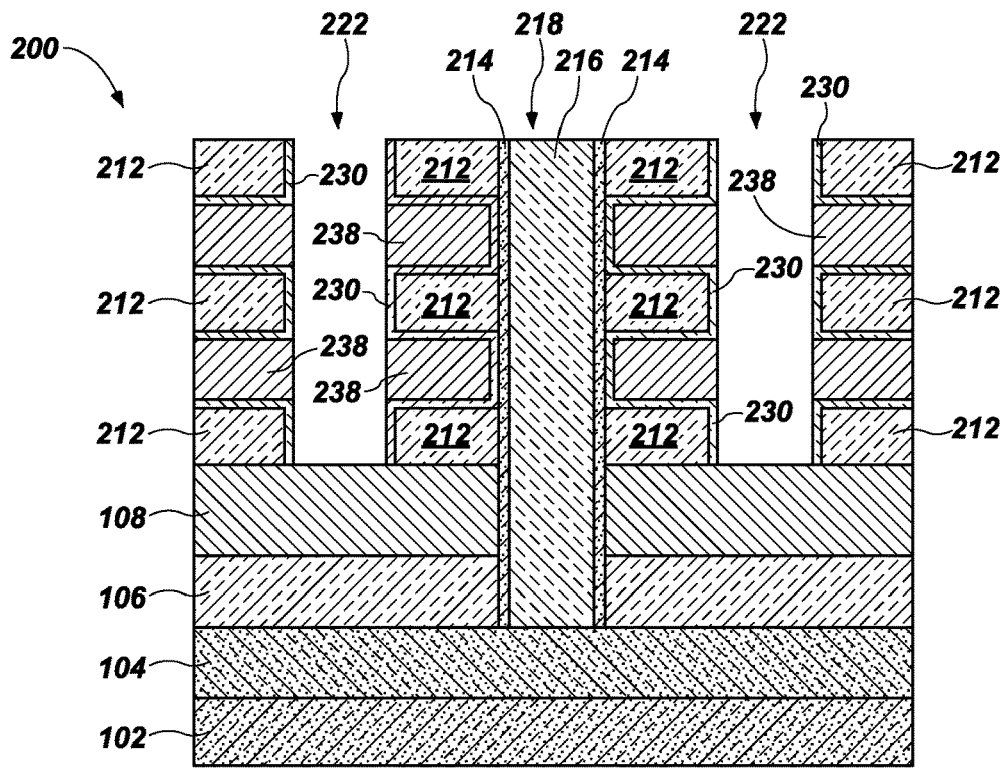

Referring to FIG. 2G, a gate material 238 may be formed within the spaces between adjacent portions of the second insulative material 212 of different levels. The gate material 238 may be substantially the same as the floating gate material 138 described above with reference to FIG. 1E. In some embodiments, the gate material 238 may be removed from sidewalls of the openings 222. In some embodiments, the openings 222 may be filled with an insulative material 240, which may comprise, for example, silicon dioxide.

Figure 2H:
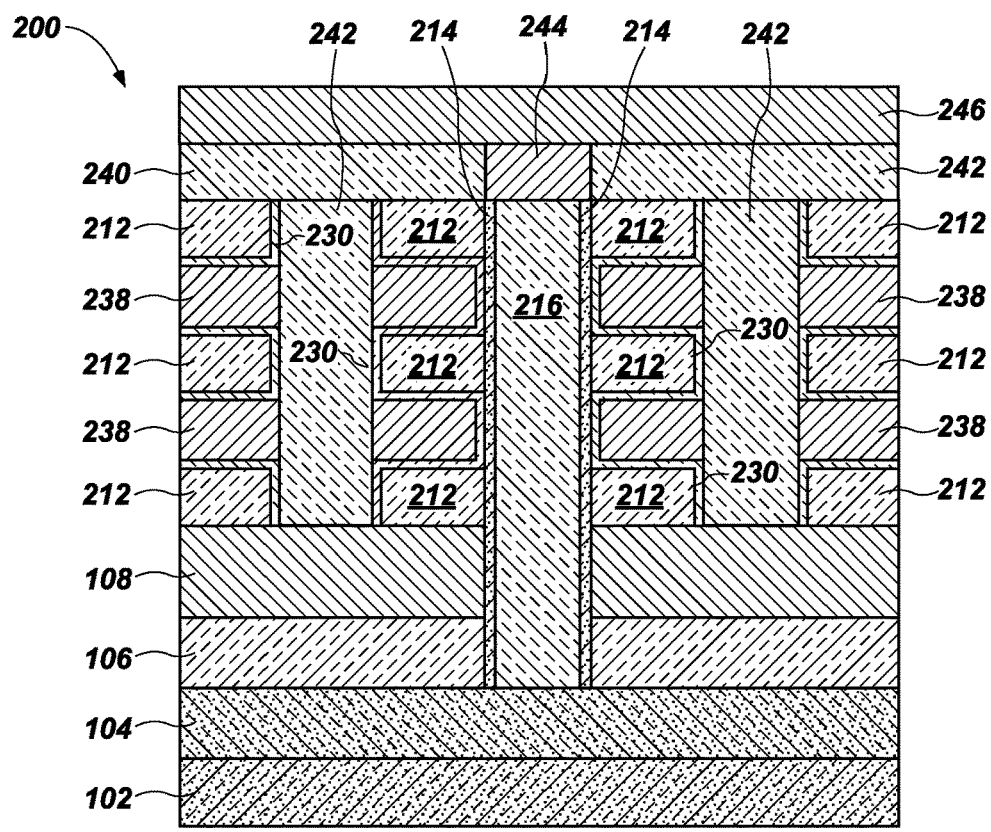

With reference to FIG. 2H, an insulative material 242 may be formed over the semiconductor device 200. The insulative material 242 may comprise, for example, silicon dioxide, silicon nitride, tetraethylorthosilicate, another insulative material, or combinations thereof. Openings may be formed in the insulative material 242 over the channel material 214 and may be filled with an electrically conductive material to form contacts 244. The contacts 244 may comprise, for example, tungsten. A conductive line (e.g., a data line, such as a bit line) 246 may overlie and contact the contacts 244. The conductive line 246 may comprise an electrically conductive material, such as tungsten.

Although FIG. 1A through FIG. 1H and FIG. 2A through FIG. 2H have been described as including semiconductor devices 100, 200 having the etch stop material 106 below stacks 105, 205 comprising the tiers 103, 203, the disclosure is not so limited. In other embodiments, a semiconductor structure may include one or more materials adjacent to (e.g., over) the etch stop material 106. Openings, trenches, holes, etc. may be formed through the one or more materials to the etch stop material 106. Thereafter, the etch stop material 106 may be removed through the respective openings, trenches, holes, etc., as described above. Accordingly, the semiconductor device may include the etch stop material.

Accordingly, in accordance with at least some embodiments of the disclosure, a semiconductor device comprises a semiconductor material extending through a stack of alternating levels of a conductive material and an insulative material, and a material comprising cerium oxide and at least another oxide adjacent to the semiconductor material.

Accordingly, in accordance with at least some embodiments of the disclosure, a method of forming a semiconductor device comprises forming openings through a stack comprising alternating levels of a first material and a second material with a first etch chemistry to expose an etch stop material comprising cerium oxide and at least another oxide, removing the exposed etch stop material with a second etch chemistry different from the first etch chemistry, and forming a semiconductor material within the openings.

Figure 3:
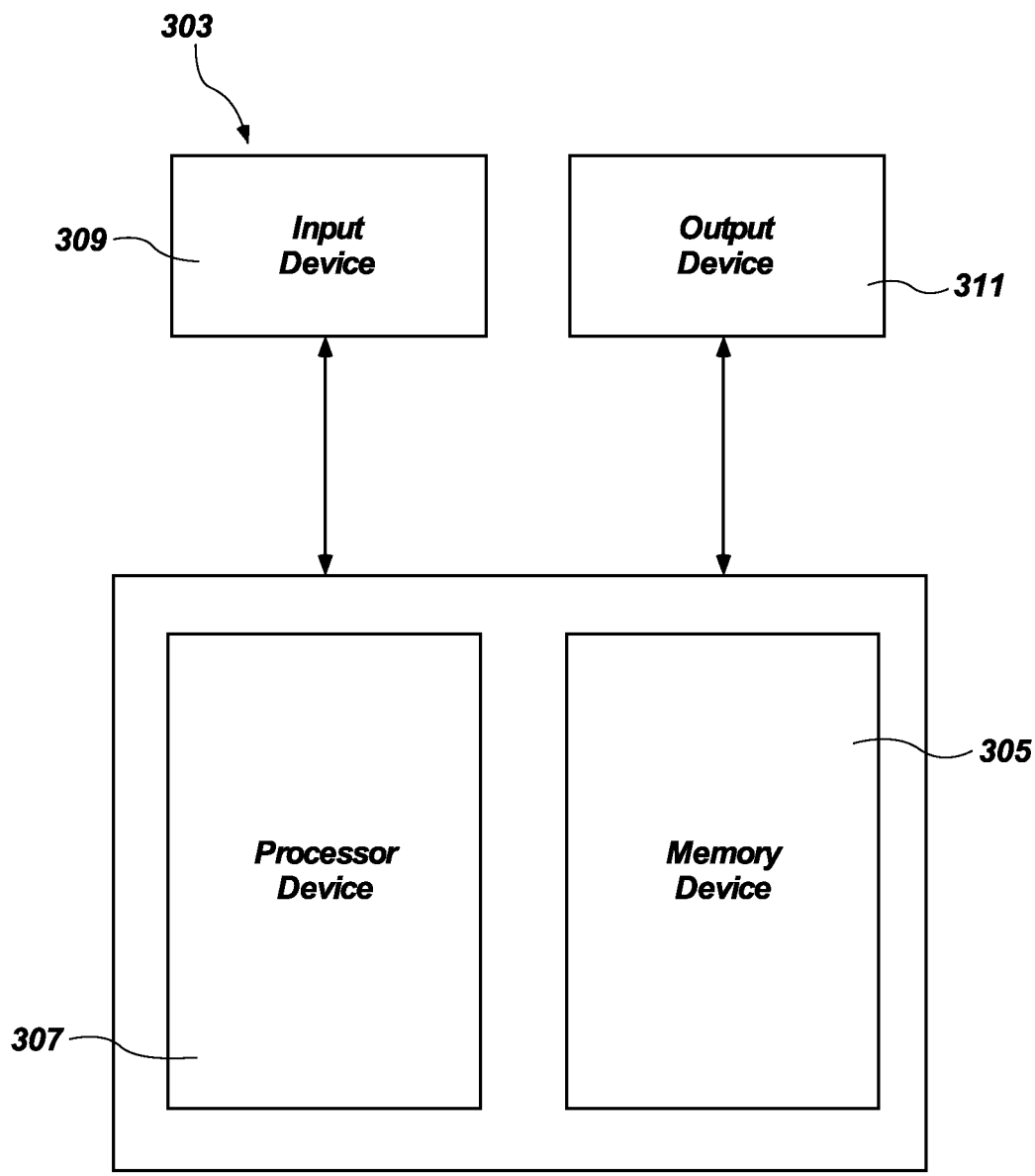
FIG. 3 is a schematic block diagram of an electronic system, in accordance with an embodiment of the disclosure.

Semiconductor devices (e.g., the semiconductor device 100, the semiconductor device 200) including the etch stop material (e.g., the etch stop material 106 in accordance with embodiments of the disclosure may be used in embodiments of electronic systems of the disclosure. For example, FIG. 3 is a block diagram of an illustrative electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a semiconductor device previously described herein (e.g., the semiconductor device 100, the semiconductor device 200) including the etch stop material (e.g., the etch stop material 106).

The electronic system 303 may further include at least one electronic signal processor device 307 (often referred to as a "microprocessor"). The electronic signal processor device 307 may, optionally, include an embodiment of a semiconductor device previously described herein (e.g., the semiconductor device 100, the semiconductor device 200). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307. In some embodiments, more than one function may be performed by a single semiconductor die, for example in the case of a system on a chip (SoC), wherein processor and memory functions are incorporated in a single die.

Thus, in accordance with embodiments of the disclosure, an electronic system comprises at least one processor device operably coupled to at least one input device and at least one output device, and a semiconductor device operably coupled to the at least one processor device. The semiconductor device comprises a first pillar comprising a first material extending through a stack structure, a second pillar comprising the first material extending through the stack structure, and an etch stop material comprising cerium oxide and an oxide of at least one of magnesium, calcium, strontium, barium, yttrium, titanium, zirconium, hafnium, niobium, tantalum, aluminum, or silicon between the first pillar and the second pillar.

EXAMPLE

Figure 4:
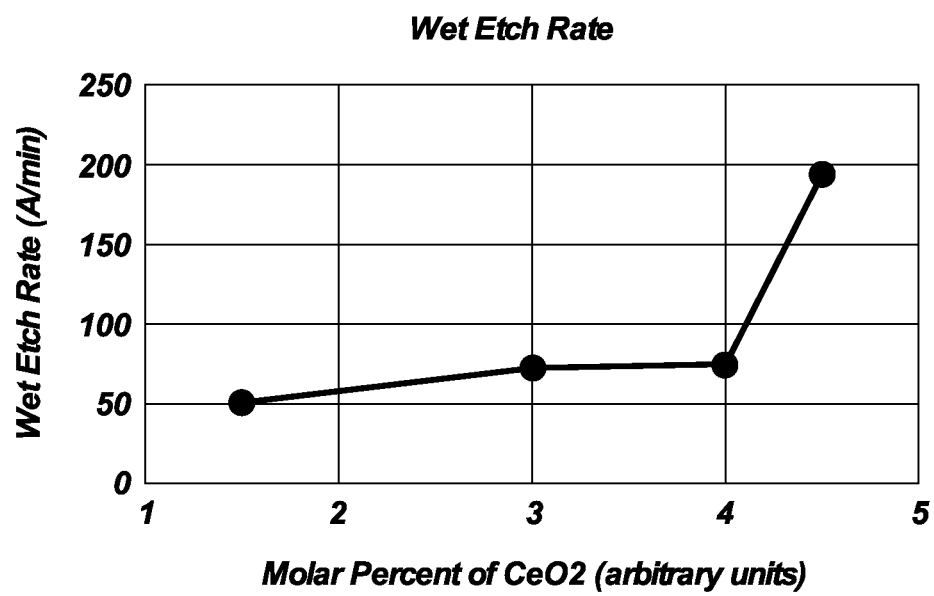
FIG. 4 is a graph illustrating a wet etch rate of etch stop materials having varying molar percent of cerium oxide, in accordance with embodiments of the disclosure.

Etch stop materials comprising cerium oxide and magnesium oxide were formed. The etch stop materials included from about 27.5 molar percent $CeO_2$ to about 57.5 molar percent $CeO_2$, with a remaining portion of the etch stop material comprising MgO. The etch stop materials were exposed to a wet etchant and the removal rate of the etch stop material was measured by conventional techniques. FIG. 4 is a graph illustrating the removal rate of the etch stop materials having varying a molar percent of cerium oxide. As illustrated in FIG. 4, as a molar percent of cerium oxide in the etch stop material increases, the wet etch rate increases. When the molar percent of cerium oxide in the etch stop material increases beyond a certain amount, the wet etch rate exhibits a rapid increase in etch rate. Accordingly, by balancing the molar percent of cerium oxide to magnesium oxide in the etch stop material, the wet etch rate thereof may be tailored.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:
1. A semiconductor device, comprising:
pillars, each comprising:
  a semiconductor material vertically extending through a stack of alternating levels of a conductive material and an insulative material; and
  a tunnel dielectric material vertically extending through the stack; and
an etch stop material laterally extending between neighboring pillars and comprising cerium oxide and magnesium oxide adjacent to the semiconductor material, the etch stop material comprising from about 27.5 molar percent cerium oxide to about 57.5 molar percent cerium oxide, from about 42.5 molar percent magnesium oxide to about 72.5 molar percent magnesium oxide, and further comprising at least one of aluminum oxide or hafnium oxide, the tunnel dielectric material terminating at an upper surface of the etch stop material.

2. The semiconductor device of claim 1, wherein the etch stop material has a thickness from about 10 nm to about 100 nm.

3. The semiconductor device of claim 1, further comprising a charge storage material between the semiconductor material and the stack of alternating levels of the conductive material and the insulative material.

4. The semiconductor device of claim 3, wherein the charge storage material comprises an oxide-nitride-oxide material.

5. The semiconductor device of claim 1, wherein the stack of alternating levels comprises at least 32 alternating levels of the conductive material and the insulative material.

6. An electronic system, comprising:
at least one processor device operably coupled to at least one input device and at least one output device; and
a semiconductor device operably coupled to the at least one processor device, the semiconductor device comprising:
  a first pillar comprising a first material extending through a stack structure, the first pillar having an aspect ratio greater than about 30:1;
  a second pillar comprising the first material extending through the stack structure; and
  an etch stop material between the first pillar and the second pillar, the etch stop material exhibiting a uniform composition and comprising hafnium magnesium cerium oxide, aluminum magnesium cerium oxide, or hafnium aluminum cerium oxide.

7. The electronic system of claim 6, wherein the stack structure comprises alternating levels of a conductive material and an insulative material.

8. A method of forming a semiconductor device, the method comprising:
forming openings through a stack comprising alternating levels of a first material and a second material with a first etch chemistry to expose an etch stop material comprising from about 27.5 molar percent cerium oxide to about 57.5 molar percent cerium oxide from about 42.5 molar percent magnesium oxide to about 72.5 molar percent magnesium oxide, and at least one of aluminum oxide or hafnium oxide;
removing exposed etch stop material with a second etch chemistry different from the first etch chemistry; and
forming a semiconductor material within the openings.

9. The method of claim 8, wherein forming openings comprises removing portions of the alternating levels of the first material and the second material with a dry etch chemistry.

10. The method of claim 8, wherein removing the exposed etch stop material with a second etch chemistry different from the first etch chemistry comprises removing the exposed etch stop material with a wet etch chemistry.

11. The method of claim 8, wherein:
forming openings through a stack comprising alternating levels of a first material and a second material comprises forming first openings and second openings through a stack of alternating levels of the first material and the second material; and
removing the exposed etch stop material with a second etch chemistry different from the first etch chemistry comprises leaving a portion of the etch stop material between the first openings and the second openings.

12. The method of claim 8, wherein forming openings through a stack comprising alternating levels of a first material and a second material comprises forming openings through a stack comprising alternating levels of an insulative material and a conductive material.

13. The method of claim 12, further comprising:
removing portions of the conductive material to form recesses;
forming a charge trapping material in the recesses; and
forming a floating gate material adjacent to the charge trapping material to form memory strings.

14. The method of claim 8, wherein forming openings through a stack comprising alternating levels of a first material and a second material comprises forming openings through a stack comprising alternating levels of a first insulative material and a second insulative material.

15. The method of claim 14, further comprising:
removing portions of the second insulative material to form recesses; and
forming a charge storage material within the recesses.

* * * * *